United States Patent [19]

Houston

[11] Patent Number: 4,620,297
[45] Date of Patent: Oct. 28, 1986

[54] SCHMITT TRIGGER BASED MEMORY CELL WITH ASSISTED TURN ON

[75] Inventor: Theodore W. Houston, Richardson, Tex.

[73] Assignee: Texas Instruments Incorporated, Dallas, Tex.

[21] Appl. No.: 646,871

[22] Filed: Aug. 31, 1984

[51] Int. Cl.$^4$ ............................................. G11C 11/34
[52] U.S. Cl. .................................................... 365/174
[58] Field of Search ................................. 365/154, 174

[56] References Cited

U.S. PATENT DOCUMENTS 3,997,881 12/1976 Hoffmann ........................... 365/174

Primary Examiner—Joseph A. Popek
Attorney, Agent, or Firm—Robert Groover, III; Melvin Sharp; Richard Donaldson

[57] ABSTRACT

A Schmitt trigger memory cell includes a storage node (20) for storage of data thereon with a current limiter resistor (22) for sinking current therefrom to a source node. A driving transistor (24) supplies current to the storage node (20) from a supply node. The gate of the transistor (24) is supplied by a current limiter resistor (28) from the supply node to turn the transistor (24) on and source current to the storage node (20). A transistor (30) is connected between the gate of the transistor (24) and the storage node (20) for shunting current from the gate of the transistor (24) to the source thereof. The transistor (30) is turned on by pulling the storage node (20) to a low voltage. To turn the transistor (24) on, the voltage on the storage node (20) is pulled high. A transistor (34) supplies current from the supply node to the gate of a transistor (24) during turn on thereof when the storage node (20) is pulled high. The transistor (34) is conducting only during turn on and not in the static condition of the memory cell. A transistor (32) is connected between the storage node (20) and the Bit Line to allow addressing of the data on the storage node (20) and writing of data thereto.

17 Claims, 4 Drawing Figures ion state. A
SCHMITT TRIGGER BASED MEMORY CELL WITH ASSISTED TURN ON

TECHNICAL FIELD OF THE INVENTION

The present invention pertains in particular to memory cells and, more particularly, to improved Schmitt trigger memory cells and the response time therefor.

BACKGROUND OF THE INVENTION

Storage of data in dense memories requires the use of a plurality of "memory cells". Each of these memory cells is comprised of a number of active devices and control lines for access thereto. These control lines allow for reading of data stored therein and writing of data thereto. Heretofore, memory cells such as cross coupled memory cells have been utilized which require two bit lines and a word line in addition to four active devices or transistors. By properly biasing the bit lines and the word lines, data can either be read out of the memory cell or written to the memory cell.

Another type of memory cell that has been previously utilized is the Schmitt trigger memory cell which is described in "New Circuit Configuration For A Static Memory Cell With An Area of 880 $\mu m^2$", Schrader and Meusberger, IEEE Journal of Solid State Circuits, Vol. SC-13 pp. 345-351, June 1978. In a Schmitt trigger memory cell, five devices are utilized with one of the devices being the control device for gating a storage node internal to the device to an external bit line. The Schmitt trigger memory cell only utilizes one bit line as compared to the two bit lines of the cross coupled memory cell. With the use of only one bit line, less area is utilized. However, one disadvantage to the current Schmitt trigger memory cell is the response time verses power requirements. A driving transistor is utilized to supply current to the storage node to raise the voltage level thereon to a high voltage level representative of a high logic state. A current source is utilized to supply current to the gate of the transistor to maintain it in a continuous conduction state. By diverting current from this current source, the voltage at the storage node can be switched to a logic low state. In making a transition from a logic low to a logic high state, the response time of the memory cell is a function of the response time of the driving transistor supplying current to the storage node. This response time is determined by the size of the gate capacitance and the current available for charging thereof.

In view of the above disadvantages, there exists a need for circuitry to reduce the response time of a Schmitt trigger memory cell without requiring a decrease in the gate capacitance of the driving transistor or an increase in the static current in the low logic state.

SUMMARY OF THE INVENTION

The present invention disclosed and claimed herein comprises a Schmitt trigger memory cell which includes a storage node for storage of a high signal level or a low signal level for a two state logic bit. A supply node is provided at a first voltage level with a source node at a second and lower voltage level. A first current limiter is connected between the storage node and the source node for limiting current therethrough to a predetermined first current limit. A first driving transistor has the drain thereof connected to the supply node, the source thereof connected to the storage node and a gate for controlling the current supplied therethrough. A second current limiter sources current to the gate of the first transistor to maintain it in a conduction state. A second transistor having the drain thereof connected to the gate of the first transistor, the source thereof connected to the storage node and the gate thereof connected to the source node is operable to turn the first transistor off when conducting. The second transistor is turned on in response to a low voltage level forced onto the storage node by sinking current from the second current limiter to the storage node. A high voltage level forced onto the storage node turns off the second transistor and allows current from the second current limiter to raise the voltage on the gate of the first transistor so as to turn on the first transistor. A gating circuit connects the storage node to an external bit line to either allow a low or high voltage to be forced thereon or allow reading of the data therefrom. A third transistor is provided for sourcing current from the supply node to the gate of the first transistor and is controlled by the voltage on the storage node to increase the current to the gate of the first transistor during turn on, thereby increasing the speed at which the gate capacitance is charged up. The third transistor is nonconducting under static conditions.

In another embodiment of the present invention, the gating circuit has the control input thereof connected to the supply node with the supply node varying between a high and low voltage level. In the high voltage mode, the external bit line is connected to the storage node and in the low voltage mode, the bit line is not connected. The state of the storage node is maintained in both the high and low voltage mode of the supply node.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
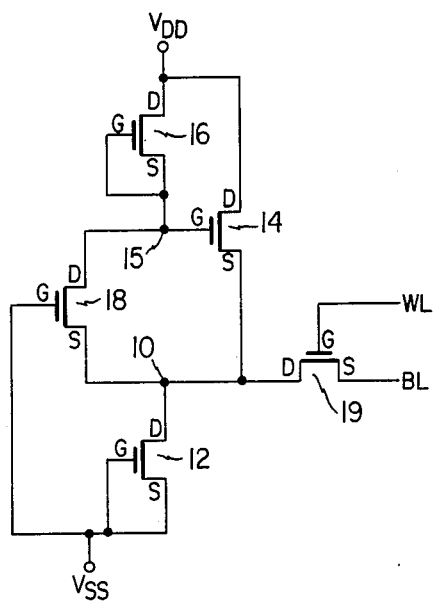
FIG. 1 illustrates a schematic diagram of the prior art Schmitt trigger memory cell.

Referring now to FIG. 1, there is illustrated a schematic diagram of a prior art Schmitt trigger memory cell. The Schmitt trigger memory cell is utilized to store a voltage internal thereto which can be accessed from a Bit Line through control of a Word Line. The Bit Line is utilized for either READ or WRITE instructions. In the WRITE mode, a bit of data is written into the memory cell and in the READ mode, that bit of data is read therefrom. Therefore, with the use of a single Bit Line, data can be read from or written into the memory cell.

Data is stored internal to the memory cell on a storage node 10. A field effect transistor 12 has the drain thereof connected to the storage node 10, the source thereof connected to a low voltage supply $V_{SS}$ and the gate thereof connected to $V_{SS}$. Hereinafter, all field effect transistors shall be referred to as "transistors". The transistor 12 is configured as a current limiter which supplies from current zero to a maximum current level that is defined by the parameters of the transistor. When the current through the transistor 12 has reached the current limit, the voltage across the drain and source thereof increases; that is, the resistance between the drain and source increases to maintain the current at the predetermined current limit.

A driving transistor 14 has the drain thereof connected to a supply voltage $V_{DD}$ and the source thereof connected to the storage node 10. The gate of the transistor 14 is connected to a reference node 15. A transistor 16 has the drain thereof connected to $V_{DD}$, the source thereof connected to the reference node 15 and the gate thereof connected to the source thereof. The transistor 16 is also configured as a current source to supply current to the gate of the transistor 14. However, the transistor 16 is not in current limit when biasing only the gate of the transistor 14, as will be described in more detail hereinbelow.

When the transistor 14 is in the ON state, current is sourced to the storage node 10 and the drain of the transistor 12. This current exceeds the current limit of the transistor 12 and the voltage on the storage node 10 is increased until the source of the transistor 14 supplies sufficient current to maintain the transistor 12 in a current limit state. The voltage on the source of the transistor 14 is referred to as the stored logic high level.

A transistor 18 has the drain thereof connected to the reference node 15, the source thereof connected to the storage node 10 and the gate thereof connected to $V_{SS}$. The transistor 18 is designed such that it does not turn on until the source voltage is essentially at or slightly above $V_{SS}$. When the transistor 18 is conducting or "turns on", current supplied through the transistor 16 is diverted through the transistor 18 to the supply node 10. The transistor 16 is designed such that it goes into a current limited state when the transistor 18 is turned on to increase the resistance thereof, thus decreasing the voltage on the reference node 15. This decreasing voltage causes the gate voltage on the transistor 14 to also decrease, thus causing the transistor 14 to increase the resistance therethrough and stop conducting. The transistor 14 is therefore "turned off". Although the transistor 18 is illustrated as having the gate thereof connected to $V_{SS}$, it should be understood that it can be designed with a threshold voltage ($V_T$) that allows the gate to be placed at any fixed reference voltage.

In order to change states on the storage node 10, it is necessary to either force the voltage on the storage node 10 to a high voltage level or to a low voltage level. If, for example, the storage node 10 is initially at a high voltage level in the static mode, this level will be maintained since the transistor 18 is turned off as a result of the source voltage being much higher than the gate voltage. With the transistor 18 turned off, the transistor 16 sources sufficient current to the gate of the transistor 14 so as to maintain that node at a high voltage, thereby causing transistor 14 to source current therethrough to the storage node 10 and the transistor 12. The amount of current sourced by the transistor 14 equals the current limit of the transistor 12 with the gate tied to the source, thus holding the voltage on the storage node 10.

To change the voltage level on the storage node 10 from a high voltage to a low voltage, it is necessary to force the voltage thereon to a voltage that will cause the transistor 18 to conduct. This requires sinking of current from the storage node 10 to divert current from the transistor 12, thereby decreasing the voltage thereon. When the voltage on storage node 10 decreases below the threshold voltage of the transistor 18 such that the gate to source voltage of transistor 18 is below the threshold voltage thereof, transistor 18 is turned on to sink current from reference node 15 to storage node 10. The current through transistor 18 is drawn from $V_{DD}$ through the transistor 16 causing it to current limit and decrease the voltage on the gate of transistor 14. When the forced low voltage is removed from storage node 10, the current supplied through the transistor 16 passes through transistor 18 to transistor 12 and to $V_{SS}$. However, this current is insufficient to increase the drain voltage of transistor 12 above the threshold voltage for the transistor 18, thus maintaining transistor 18 in conduction and the storage node 10 at a low voltage level.

To change from a low voltage level to a high voltage level, current is forced into the storage node 10 to cause transistor 12 to go into current limit. When transistor 12 goes into current limit, the voltage on storage node 10 increases and transistor 18 is turned off. When transistor 18 is turned off, current through transistor 16 is supplied to the gate of capacitance transistor 14 to increase the voltage on the gate thereof and cause transistor 14 to turn on. Transistor 14 then supplies sufficient current to the storage node 10 and the drain of transistor 12 to maintain transistor 12 in current limit.

To source or sink current to the storage node 10, a transistor 19 is provided with the drain thereof connected to the storage node 10, the source thereof connected to the Bit Line (BL) and the gate thereof connected to the Word Line (WL). Under control of the Word Line, the Bit Line can be directly connected to the memory cell. To WRITE data, it is only necessary to source or sink an appropriate amount of current. However, to READ data, it is only necessary to sample the voltage level, thus requiring a high impedance on the Bit Line.

Figure 2:
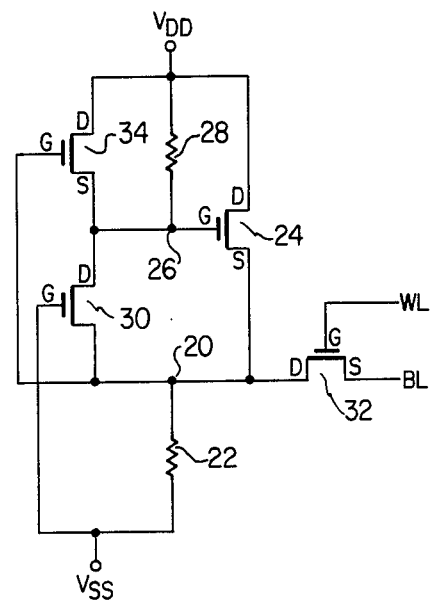
FIG. 2 illustrates a schematic diagram of the memory cell with the assisted turn on of the driving transistor in accordance with the present invention.

Referring now to FIG. 2, there is illustrated a schematic diagram of a Schmitt trigger memory cell in accordance with the present invention. The Schmitt trigger memory cell of FIG. 2 has a storage node 20 for storing a voltage level thereon. A supply source $V_{DD}$ and a reference voltage $V_{SS}$ are also provided to generate a voltage across the memory cell. A resistor 22 is connected between the storage node 20 and $V_{SS}$. The resistor 22 is functionally similar to the transistor 12 in that it approximates a current limiting type device.

A driving transistor 24 has the drain thereof connected to $V_{DD}$, the source thereof connected to the storage node and the gate thereof connected to a reference node 26. A resistor 28 has one end thereof connected to the reference node 26 and the other end thereof connected to $V_{DD}$. The resistor 28 is functionally similar to the transistor 16 in FIG. 1 in that it approximates a current limiter. In addition, transistor 24 is functionally equivalent to transistor 14 in FIG. 1.

A transistor 30 has the drain thereof connected to the reference node 26, the source thereof connected to the storage node 20 and the gate thereof connected to $V_{SS}$. The transistor 30 is functionally equivalent to the transistor 18 in FIG. 1 and it is operable to shunt the reference node 26 to the storage node 20 when turned on. To connect the storage node 20 to the Bit Line, a transistor 32 is provided with the drain thereof connected to the source node 20, the source thereof connected to the Bit Line and the gate thereof connected to the Word Line. The transistors 24, 30 and 32 and the resistors 22 and 28 are the equivalent of the circuit of FIG. 1 in operation. By utilizing resistors 22 and 28 in place of the transistors 12 and 16, fewer active devices are required.

The storage of a low voltage level on the storage node 20 requires a current sink at the Bit Line through transistor 32. This current sink causes the voltage at storage node 20 to decrease to a low value, thus turning on transistor 30. When transistor 30 is turned on, reference node 26 is pulled down to the low voltage level of storage node 20, thus turning off transistor 24. This operation is similar to that described above with reference to FIG. 1.

During the transistion of a low voltage level to a high voltage level on storage node 20, a transistor 34 is provided to decrease the response time. The transistor 34 has the drain thereof connected to $V_{DD}$, the source thereof connected to the reference node 26 and the gate thereof connected to the storage node 20. The transistor 34 is operable to supply current from $V_{DD}$ to the reference node 26 during turn on of the transistor 24. However, the transistor 34 does not conduct in the static condition where the storage node 20 is at either a low voltage level or at a high voltage level with no current being sourced or sinked through the transistor 32.

During transition from a low voltage level to a high voltage level, current is sourced from the Bit Line through transistor 32 to storage node 20, which resides at a low voltage level in the static condition. When current is sourced through resistor 22, the voltage on storage node 20 is raised to a predetermined level, depending upon the source current. When the voltage on the storage node 20 is raised, the voltage on the source of transistor 30 increases to a level above the gate that causes transistor 30 to turn off. When transistor 30 turns off, the voltage on reference node 26 is initially at a low voltage level. This initial low voltage level is also on the gate of transistor 24, which source is at the high voltage level of the storage node 20. Since there is no current path through the transistor 30, current is supplied to the gate of transistor 24 through resistor 28 to raise the gate voltage to a value essentially equal to $V_{DD}$ with a very small voltage drop across resistor 28. This will turn on transistor 24 with the voltage at the source equal to the gate voltage offset by the threshold voltage of the transistor 24. However, there is a finite time required for the voltage on reference node 26 to increase from the initial low voltage to the voltage required to turn on transistor 24. This is the time required to charge the capacitance associated with node 26. In accordance with the present invention transistor 34 is operable to supply current to decrease this response time.

When transistor 30 is initially turned off, the voltage on reference node 26 is at a low voltage level and the voltage on storage node 20 is at a high voltage level. Therefore, the gate voltage on transistor 34 is higher than the voltage on the source thereof. This causes transistor 34 to conduct, thus supplying current to reference node 26 and to the gate of transistor 24. Transistor 34 supplies current to reference node 26 to bias transistor 24 on and pull reference node 26 up to a voltage level that is equal to the voltage on the source of transistor 24 offset by the threshold voltage. At this point, current is supplied through the resistor 28 to increase the voltage on the node 26 above that point, at which time the transistor 34 does not conduct. For example, if the storage node 20 is forced to a voltage of $V_{DD}$ and the threshold voltage $V_T$ of transistor 34 is ±0.5 volts, transistor 34 will supply current to the reference node 26 until the voltage on reference node 26 equals $V_{DD}$ −0.5. At this point, current is supplied by the resistor 28 to the gate of transistor 24 to increase the voltage on the reference node 26 to approximately $V_{DD}$. This effectively turns off transistor 34.

When transistor 30 is conducting due to a low voltage on the storage node 20, the source of transistor 34 will be at a voltage that is slightly higher than the gate voltage thereon. The $V_T$ of transistor 34 is chosen such that this condition maintains transistor 34 in a nonconducting mode. Therefore, transistor 34 only conducts during charging of the gate capacitance of transistor 24 to decrease the response time thereof. By maintaining transistor 34 turned off during static conditions, current requirements are lower for static operating conditions.

In an example of a typical circuit, the value for resistor 22 is equal to 1 Meg Ohm and the value for resistor 28 is 10 Meg Ohms. The threshold voltages $V_T$ for the transistors 24, 30, 32 and 34 are listed in Table 1 with the width to length ratio (W/L) of the gate illustrated also.

TABLE 1

| TRANSISTOR | W/L | $V_T$ (volts) |
|---|---|---|
| 32 | 2 | −0.5 |
| 24 | 1 | +0.5 |
| 32 | 4 | +1.6 |
| 34 | 2 | +0.5 |

Figure 3:
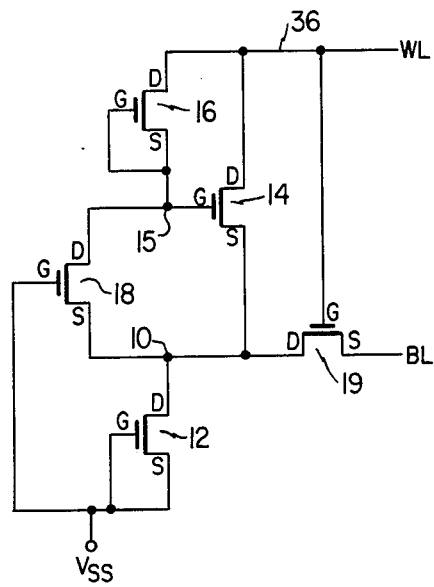
FIG. 3 illustrates an alternate embodiment of the Schmitt trigger memory cell of FIG. 1 with a varying supply node.

Referring now to FIG. 3, there is illustrated a schematic diagram of the memory cell of FIG. 1 with an alternate method of activating the transistor 19, wherein like numerals refer to like parts in the various Figures. The drains of both transistors 14 and 16 are connected to a node 36 rather than to $V_{DD}$. In addition, the gate of the transistor 19 is also connected to the node 36 with the node 36 connected to the Word Line. The Word Line is varied between a voltage approximating $V_{DD}$ and an intermediate voltage. At the intermediate voltage, the transistor 19 is not conducting for both the low voltage state on the node 10 or the high voltage state thereon. When the Word Line is at the high voltage level approximating $V_{DD}$, the transistor 19 conducts. By connecting the drains of transistors 14 and 16 to the Word Line, one less run is required to input $V_{DD}$ to the memory cell.

Figure 4:
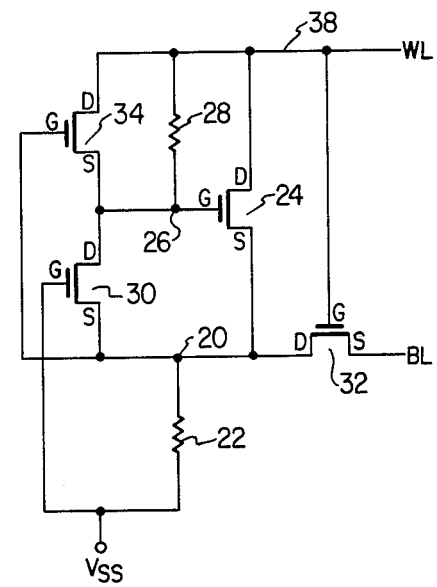
FIG. 4 illustrates a schematic diagram of the Schmitt trigger memory cell of FIG. 2 with the varying supply node.

Referring now to FIG. 4, there is illustrated a schematic diagram of an alternate embodiment of the memory cell of FIG. 2, wherein like numerals refer to like parts in the two figures. The drains of both the transistors 24 and 34 are connected to a node 38 and the resistor 28 has the end thereof opposite the reference node 26 connected to the node 38. The node 38 is connected to the Word Line rather than $V_{DD}$. The operation is similar to that described with reference to FIG. 3 in that the Word Line varies between a high voltage and an intermediate voltage. The transistor 32 is turned on when the Word Line is at the high voltage and turned off when the gate of the transistor 32 is at the intermediate voltage level. For example, with the values listed in Table 1, the Word Line can be placed at a voltage of 3.0 volts to turn on the transistor 32 with an intermediate voltage of +1.5 volts to turn the transistor 32 off.

When the node 38 is at the high voltage level and the transistor 32 is turned on, the Bit Line is either a READ or a WRITE mode. In the READ mode, very little current is drawn through the transistor 32 such that the voltage level on the storage node 20 is minimally affected to prevent state change in the transistors 24 and 30. However, in the WRITE mode, the Bit Line sources current or sinks current, depending upon the data to be stored on the storage node 20. When the READ or WRITE function is complete, the Word Line goes from the high voltage level to the intermediate voltage level. At the intermediate voltage level, both the voltages on the storage node 20 and the reference node 26 decrease. However, the transistors 24 and 30 maintain the conduction states thereof that existed prior to turn off of transistor 32, thus retaining the appropriate voltage level on the storage node 20.

In summary, there has been provided a Schmitt trigger memory cell with an assisted turn on of the driving transistor for making a transition from a logic low to a logic high. By providing an assisted turn on, the current requirements under static conditions are reduced with higher current supplies to the gate of the driving transistor only during turn on thereof. This decreases the response time of the memory cell without increasing the static power requirements.

Although the preferred embodiment has been described in detail, it should be understood that various changes, substitutions and alterations can be made therein without departing from the spirit and scope of the invention as defined by the appended claims. In particular, MESFET devices could be utilized rather than MOS devices.

What is claimed is:

1. A Schmitt trigger based memory cell, comprising:
   a storage node for storing a first stored voltage and a second stored voltage representative of high and low logic states, respectively;
   first means having an active state and an inactive state for maintaining said storage node at said first voltage when in the active state;
   second means having an active state and an inactive state for switching said first means to the inactive state and maintaining said node at said second voltage when said second means is in the active state;
   said second means changing states from inactive to active when the second voltage is forced on said node and from active to inactive when the first voltage is forced on said node;
   said first means switching from inactive to active state in a predefined period of time when said second means switches states from active to inactive;
   assist means for decreasing said predefined period of time, said assist means operable only during transition of said first means from the inactive to active state such that said assist means is inactivated during static operation of the memory cell; and
   means for connecting an external source to said node to force an external high or low voltage thereof, removal of said forced high or low voltage allowing said storage node to remain at said first or second storage voltage without change.

2. A Schmitt trigger based memory cell, comprising:
   a storage node for storage of a high signal level or a low signal level for a two state logic bit;
   a supply node at a first voltage level;
   a source node at a second voltage level below said first voltage level;
   first current limiter means connected between said storage node and said source node for limiting current therethrough to a predetermined first limit current;
   a first driving transistor with a drain connected to said supply node, a source connected to said storage node and a gate connected to a reference node, the voltage on said reference node controlling the current supplied through said first transistor to said storage node;
   second current limiter means connected between said supply node and said reference node for supplying current thereto;
   a second transistor having a drain connected to said reference node, a source connected to said storage node and a gate connected to a fixed reference voltage;
   said second transistor turned on by a forced low voltage on said storage node and turned off by a forced high voltage on said storage node, current from said second current limiter means supplied to said first current limiter means when said second transistor is turned on;
   said second transistor lowering the voltage on said reference node when turned on to thereby turn off said first transistor, said first transistor turned on when said second transistor is turned off;
   means for supplying current from said supply node to said reference node only during turn on of said first transistor; and
   means for connecting said storage node with an external bit line to either read the voltage level thereon or to write the voltage level thereon, said writing effected by forcing said storage node to a high or low voltage level depending upon the voltage written thereto.

3. The memory cell of claim 2 wherein said first current limiter means comprises a transistor configured as a current limiter with a drain connected to said storage node, a source connected to said source node and a gate connected to said source node.

4. The memory cell of claim 2 wherein said second current limiter means comprises a transistor configured as a current limiter having a drain connected to said supply node, a source connected to the gate of said first transistor and a gate connected to the gate of said first transistor.

5. The memory cell of claim 2 wherein said first current limiter means comprises a resistor having one end thereof connected to said storage node and the other end thereof connected to said source node.

6. The memory cell of claim 2 wherein said second current limiter means comprises a resistor having one end thereof connected to said supply node and the other end thereof connected to the gate of said first transistor.

7. The memory cell of claim 2 wherein said current supplying means is controlled by the signal level on said storage node such that current is supplied to the gate of said first transistor in response to the signal level on said storage node changing states.

8. The memory cell of claim 2 wherein said current supply means supplies current only during the transition of the signal level on said storage node from the low voltage state to the high voltage state with no current being supplied at the low voltage state or at the high voltage state.

9. The memory cell of claim 2 wherein said connecting means comprises a transistor having a drain connected to the source of said first transistor, a source connected to the external bit line and a gate for controlling the operation of said transistor, said gate connected to an external control signal.

10. The Schmitt trigger memory cell of claim 2 wherein said connecting means is controlled by the voltage level of said supply node, said supply node varying between a low level and a high level, said low level maintaining the voltage level on said storage node and said high level allowing the voltage level stored on said storage node to be read without affecting the relative level thereon or written to by forcing the desired level thereto.

11. A Schmitt trigger based memory cell, comprising:
a storage node for being maintained at a high voltage level or a low voltage level representative of a high or low logic state, respectively;
a supply node at a first voltage level;
a source node at a second voltage level lower than said first voltage level;
a first current limiter attached between said storage node and said source node for limiting current therebetween;
a first transistor having a drain connected to said supply node, a source connected to said storage node and a gate connected to a reference node, the gate for controlling the conduction between the source and drain;
a second current limiter attached between said supply node and said storage node to supply sufficient current thereto;
a second transistor having a drain connected to said reference node, a source node connected to said storage and a gate connected to said source node;
said second transistor turning on when the voltage level of said storage node is pulled below a predetermined value, turn on of said second transistor causing current to be withdrawn from said second current limiter to lower the voltage on said reference node and turn said first transistor off;
said second transistor turning off when current is supplied to said storage node to increase the voltage thereon, turn off to said second transistor causing the voltage on said reference node to increase and turn said first transistor on to supply current to said first current limiter and increase the voltage on said storage node to maintain said second transistor turned off;
gated current source means connected between said supply node and the gate of said first transistor and gated by the voltage level on said storage node, said gated means supplying current to said reference node during turn on of each first transistor, said gated means nonconducting when said first transistor is turned off and when said first transistor is fully turned on such that current is drawn therethrough only during turn on of said first transistor; and
read/write means for connecting said storage node to an external source to selectively force said storage node to either a high or low voltage level for changing voltage levels stored thereon.

12. The memory cell of claim 11 wherein said first and second current limiters comprise resistors.

13. The memory cell of claim 11 wherein said first current limiter comprises a transistor having a drain connected to said supply node, a source connected to the gate of said first transistor and a gate connected to the drain thereof.

14. The memory cell of claim 11 wherein said second current limiter comprises a transistor having a drain connected to said storage node, a source connected to said source node and a gate connected to said source node.

15. The memory cell of claim 11 wherein said gated means comprises a transistor having a drain connected to said supply node, a source connected to the gate of said first transistor and a gate connected to said source node, said gated transistor turned on when the voltage on said storage node exceeds the voltage on the source thereof by a predetermined amount for the duration of time required to turn on said first transistor.

16. The memory cell of claim 11 wherein said means for connecting comprises a transistor having the drain connected to the source of said first transistor, a source connected to an external bit line and a gate connected to an external control signal, said external control signal connecting said bit line with said source node such that the voltage levels thereon can be selectively forced high or low.

17. The memory cell of claim 11 wherein said connecting means comprises a transistor having a drain connected to said storage node, a source connected to an external bit line and a gate connected to said supply node, said supply node varying between a first control voltage level and a second control voltage level, said first control level connecting said external bit line to said storage node and said second control line turning off said control transistor and maintaining the voltage level on said storage node at the level present prior to turn off of said control transistor.

* * * * *